(12) United States Patent
Clough

(10) Patent No.: US 9,994,754 B2
(45) Date of Patent: Jun. 12, 2018

(54) FILLED POLYDIORGANOSILOXANE-CONTAINING COMPOSITIONS, AND METHODS OF USING SAME

(71) Applicant: 3M INNOVATIVE PROPERTIES COMPANY, St. Paul, MN (US)

(72) Inventor: Robert S. Clough, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days. days.

(21) Appl. No.: 15/129,532

(22) PCT Filed: Mar. 20, 2015

(86) PCT No.: PCT/US2015/021832
§ 371 (c)(1),
(2) Date: Sep. 27, 2016

(87) PCT Pub. No.: WO2015/148318
PCT Pub. Date: Oct. 1, 2015

(65) Prior Publication Data
US 2017/0174970 A1    Jun. 22, 2017

Related U.S. Application Data

(60) Provisional application No. 61/971,335, filed on Mar. 27, 2014.

(51) Int. Cl.
| | |
|---|---|
| C08F 2/46 | (2006.01) |
| C08F 2/50 | (2006.01) |
| C08G 61/04 | (2006.01) |
| C09K 5/14 | (2006.01) |
| C08K 3/00 | (2018.01) |
| C08K 3/22 | (2006.01) |
| C08G 77/20 | (2006.01) |
| C08G 77/28 | (2006.01) |
| C09J 183/04 | (2006.01) |

(52) U.S. Cl.
CPC ............... C09K 5/14 (2013.01); C08G 77/20 (2013.01); C08G 77/28 (2013.01); C08K 3/0033 (2013.01); C08K 3/22 (2013.01); C09J 183/04 (2013.01); C08K 2003/2227 (2013.01); C08K 2201/001 (2013.01)

(58) Field of Classification Search
USPC .................. 522/7, 6, 1, 71, 189, 184; 520/1
See application file for complete search history.

(56) References Cited

U.S. PATENT DOCUMENTS

| | | | |
|---|---|---|---|
| 4,072,635 A | 2/1978 | Jeram | |
| 4,777,191 A | 10/1988 | Komai | |
| 4,946,874 A | 8/1990 | Lee | |
| 4,970,244 A | 11/1990 | Komai | |
| 5,158,988 A * | 10/1992 | Kurita | C08K 5/53 522/64 |
| 6,255,738 B1 * | 7/2001 | Distefano | H01L 23/24 257/787 |
| 6,284,829 B1 | 9/2001 | Dalbe | |
| 6,596,445 B1 | 7/2003 | Matsumoto | |
| 7,105,584 B2 | 9/2006 | Chambers | |
| 2010/0304338 A1 | 12/2010 | Cramer | |
| 2013/0287345 A1 * | 10/2013 | Van Den Berg | C08G 77/392 385/94 |

FOREIGN PATENT DOCUMENTS

| | | |
|---|---|---|
| EP | 0 126 541 B1 | 11/1984 |
| EP | 0 481 758 * | 4/1992 |
| EP | 0 481 758 A1 | 4/1992 |
| JP | 2010-285519 | 12/2010 |
| JP | 5628489 | 10/2014 |

OTHER PUBLICATIONS

Database WPI Week 201106, Thomson Scientific, London, GB; AN 2010-Q62101, XP-002740020, 3 pages.
Jacobine in "Radiation Curing in Polymer Science and Technology". Volume III Polymerization Mechanisms, ed. By J.P. Fouassier and J.F. Rabek, Elsevier Science Publishes Ltd, Essex, England, copyright 1993, Chapter 7, Thiol-Ene Photopolymers. pp. 253-254.
Inoue "Effects of Multi-modal 1-21 Filler Size Distributions on Thermal Conductivity of Electrically Conductive Adhesives Containing Ag Micro and Nanoparticles", Transactions of the Japan Institute of Electronics Packaging, Jan. 2009, vol. 2, No. 1, pp. 125-133.
Muller "Photocrosslinking of Silicones. Part 13. Photoinduced Thiol-Ene Crosslinking of Modified Silicones". Journal of Macromolecular Science Part A—Pure and Applied Chemistry, 1996, vol. 33, No. 4, pp. 439-457.
Karchmer as cited in S. Siggia's "Quantitative Organic Analysis via Functional Groups", Wiley and Sons, 1963. pp. 582-586.
Snell, Commercial Methods of Analysis, 1944, pp. 345-346, McGraw-Hill, New York.
Zhang: "Study on the Bimodal filler Influence on the Effective Thermal Conductivity of Thermal Conductive Adhesive," Microsystem Technologies, vol. 17, No. 1, Jan. 2011, pp. 93-99.
International Search Report for PCT International Application No. PCT/US2015/021832, dated Jun. 2, 2015, 4 pages.

* cited by examiner

Primary Examiner — Jessica Whiteley
(74) Attorney, Agent, or Firm — Bradford B. Wright

(57) ABSTRACT

Compositions, particularly photocurable compositions that can cure upon irradiation, cured compositions, and methods of making such cured compositions, wherein the photocurable compositions include a polydiorganosiloxane having vinyl functionality, a polydiorganosiloxane having thiol (i.e., mercapto) functionality, and a thermally conductive filler.

21 Claims, No Drawings

FILLED POLYDIORGANOSILOXANE-CONTAINING COMPOSITIONS, AND METHODS OF USING SAME

BACKGROUND

Thermally conductive adhesives and pads are known and used in electronics, lighting, and rechargeable battery assemblies to convey heat away from a heat source and transfer it to a heat sink where it can be dissipated. They are important in the thermal management of devices with semiconductor chips, such as computers, and lighting based on light emitting diodes (LED's), such as overhead lighting and televisions. Conventional products are based on silicone resins that are highly filled with thermally conductive, inorganic particles. Typically, the silicone products are manufactured by a web-based, thermal cure process followed by a batch thermal cure to complete the hydrosilylation chemical reaction.

Greater thermal conductivity of these products is advantageous. One approach to achieve greater thermal conductivity is to add higher levels of thermally conductive, inorganic particles, which can increase the bulk thermal conductivity of the material. However, conformability is another important performance parameter for these materials. The conformability of the thermally conductive material is important since the material may be between surfaces, e.g., a surface of the heat source and a surface of the heat sink, that are irregular, that is not perfectly smooth, or the gap between the two surfaces in which the material is intended to fill not of the same distance throughout. Better conformability can provide better contact between the thermally conductive material and the heat source and heat sink surfaces. Better conformability may speed proper assembly and lower costs. Better conformability can also improve heat transfer at the interfaces of the material with the heat source and heat sink owing to the improved contact between these surfaces. The overall heat transfer rate is dependent on the heat transfer rates at these interfaces and the bulk heat transfer rate through the bulk of the thermally conductive material. Thus, there is a balance between increasing the thermally conductive filler content and maintaining or improving conformability to achieve optimal performance. The resin and resin chemistry can also play an important role in determining conformability.

SUMMARY

Thus, there is a need for the present disclosure that provides silicone-based (i.e., polydiorganosiloxane-based) compositions and products, with their inherent advantages of superior thermal oxidative stability, that have an improved balance of overall thermal conductivity and conformability and that can be produced using a more cost effective web-based, photocuring process. The present disclosure provides compositions, particularly photocurable compositions (i.e., photocurable reaction mixtures) that can cure (e.g., polymerize and/or crosslink) upon irradiation, cured compositions, and methods of making such cured compositions. The photocurable compositions include polydiorganosiloxanes having vinyl functionality, polydiorganosiloxanes having thiol (i.e., —SH or mercapto) functionality, and thermally conductive filler. The cured compositions can be used to form thermally conductive adhesives and pads, for example.

In a first aspect, the present disclosure provides a photocurable composition (i.e., photocurable reaction mixture) that includes: a vinyl-functional polydiorganosiloxane having functional groups, wherein the functional groups consist of vinyl groups; a thiol-functional polydiorganosiloxane having functional groups, wherein the functional groups consist of thiol groups, and wherein the thiol-functional polydiorganosiloxane has an average thiol equivalent weight of 1200 Daltons or more; a phosphine oxide photoinitiator; and at least 35 weight percent (wt-%) thermally conductive filler, based on the total weight of the photocurable reaction mixture, wherein the filler has at least a bi-modal particle size distribution.

In a second aspect, the present disclosure provides a method of making a cured composition, the method includes combining components to form a photocurable reaction mixture and irradiating (e.g., with UV-visible radiation) the photocurable reaction mixture to form a cured composition. The components include: a vinyl-functional polydiorganosiloxane having functional groups, wherein the functional groups consist of vinyl groups; a thiol-functional polydiorganosiloxane having functional groups, wherein the functional groups consist of thiol groups, and wherein the thiol-functional polydiorganosiloxane has an average thiol equivalent weight of 1200 Daltons or more; a phosphine oxide photoinitiator; and at least 35 wt-% thermally conductive filler, based on the total weight of the photocurable reaction mixture, wherein the filler has at least a bi-modal particle size distribution.

In a third aspect, the present disclosure provides a cured composition that includes: a polydiorganosiloxane polymer having —C—S—C—C— linkages (e.g., —CH$_2$—S—CH$_2$—CH$_2$— linkages); and at least 35 wt-% thermally conductive filler, based on the total weight of the composition, wherein the filler has at least a bi-modal particle size distribution; wherein the cured composition has a thermal conductivity of at least 2.4 W/m° K (as measured by Measurement of Thermal Conductivity test method with 1 kg weight) and a Shore 00 hardness of up to 85.

As used herein, the term "organic group" means a hydrocarbon group (with optional elements other than carbon and hydrogen, such as oxygen, nitrogen, sulfur, phosphorus, and silicon) that is classified as an aliphatic group, cyclic group, or combination of aliphatic and cyclic groups (e.g., alkaryl and aralkyl groups). In the context of the present invention, the organic groups are those that do not interfere with the curing reactions (e.g., polymerization and/or crosslinking reactions). The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group other than an aromatic group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.). A group that may be the same or different is referred to as being "independently" something.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of." Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one."

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and preferably by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used.

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

When a group is present more than once in a formula described herein, each group is "independently" selected, whether specifically stated or not. For example, when more than one R group is present in a formula, each R group is independently selected. Furthermore, subgroups contained within these groups are also independently selected.

As used herein, the term "room temperature" refers to a temperature of 19° C. to 25° C. or 20° C. to 23° C.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

DETAILED DESCRIPTION OF ILLUSTRATIVE EMBODIMENTS

The present disclosure provides compositions, particularly photocurable compositions (i.e., photocurable reaction mixtures) that can cure (e.g., polymerize and/or crosslink) upon irradiation, cured compositions, and methods of making such cured compositions. The cured compositions can be used to form thermally conductive adhesives and pads, for example.

The photocurable compositions include polydiorganosiloxanes having vinyl functionality, polydiorganosiloxanes having thiol (i.e., mercapto) functionality, thermally conductive filler, and one or more photoinitiators.

The photocurable compositions of the present disclosure typically require an initiator that generates free radicals. These free radicals initiate the free radical addition of thiol to alkene, and consequently the cure of the mercapto-functional polydiorganosiloxanes with vinyl-functional polydiorganosiloxanes. Photoinitiators, which decompose upon exposure to light (UV or visible) and generate free radicals, can be utilized. Preferred are phosphine oxide photoinitiators, optionally in combination with one or more secondary photoinitiators.

In particular, the present disclosure provides a photocurable composition (i.e., photocurable reaction mixture) that includes: a vinyl-functional polydiorganosiloxane having functional groups, wherein the functional groups consist of vinyl groups; a thiol-functional polydiorganosiloxane having functional groups, wherein the functional groups consist of thiol groups, and wherein the thiol-functional polydiorganosiloxane has an average thiol equivalent weight of 1200 Daltons or more; a phosphine oxide photoinitiator; and at least 35 wt-% thermally conductive filler, based on the total weight of the photocurable reaction mixture.

Upon irradiation of the photocurable reaction mixture (e.g., with UV-visible radiation), a cured composition is formed that includes: a polydiorganosiloxane polymer having —C—S—C—C— linkages (e.g., —$CH_2$—S—$CH_2$—$CH_2$— linkages); and at least 35 wt-% thermally conductive filler, based on the total weight of the composition.

The filler has at least a bi-modal particle size distribution. By "at least" in this context, it is meant that the filler can be bi-modal, tri-modal, etc. A bi-modal filler has two distinct populations with differing average particle sizes (e.g., a first portion having an average particle size of at least 33 microns, and a second portion having an average particle size of less than 33 microns). A tri-modal filler has three distinct populations with differing average particle sizes.

The cured composition has a thermal conductivity of at least 2.4 Watts/meter-° Kelvin (W/m-° K) under a weight of 1 kilogram (kg) according to the Measurement of Thermal Conductivity Test described in the Examples Section. For certain embodiments, the higher the thermal conductivity, the better.

There is a balance, however, between increasing the thermally conductive filler content and maintaining or improving conformability to achieve optimal performance. The cured composition has a Shore 00 hardness of up to 85 (i.e., 85 or lower), or up to 75 (i.e., 75 or lower). For certain embodiments, the lower the Shore 00 hardness value, the softer or more conformable is the material.

Vinyl-Functional Polydiorganosiloxanes

Suitable vinyl-functional polydiorganosiloxanes are those compounds (e.g., oligomer, polymerizable polymer (i.e., prepolymer)) that include a plurality of vinyl groups. Preferably, these compounds consist of only vinyl functionality. That is, there are no other groups that are reactive in these compounds other than the vinyl groups.

Preferably, the vinyl-functional polydiorganosiloxanes may be represented by the following formula (Formula I):

$$R^2(R)_2SiO((R)_2SiO)_x(RR^1SiO)_ySi(R)_2R^2 \quad (I)$$

wherein: each R independently represents methyl or phenyl; each $R^1$ independently represents a vinyl group (i.e., $-HC=CH_2$); each $R^2$ independently represents methyl, phenyl, or vinyl groups; x is 1 or more; y is 0 or more. Formula (I) may include compounds with internal vinyl groups only, compounds with terminal vinyl groups only, or compounds with both internal and terminal vinyl groups. For compounds of Formula (I) having only internal vinyl groups, y is 2 or more, each $R^1$ is vinyl, and each $R^2$ is methyl or phenyl (preferably, methyl). For compounds of Formula (I) having only terminal vinyl groups, y is 0 and each $R^2$ is vinyl. For compounds of Formula (I) having both terminal vinyl groups and internal vinyl groups, y is 1 or more, each $R^1$ is a vinyl, and each $R^2$ is typically vinyl. If one $R^2$ group is vinyl, typically both $R^2$ groups are vinyl. In Formula (I), the x repeat units $((R)_2SiO)$ and y repeat units $(RR^1SiO)$ may be within the polymer in random and/or block arrangements.

In most embodiments, the vinyl-functional polydiorganosiloxanes of Formula (I) are available as a mixture of materials. The mixture usually contains materials of Formula (I) with different molecular weights. Additionally, for vinyl-functional polydiorganosiloxanes having only internal vinyl groups, the mixture contains an average of at least two vinyl groups per compound. Such a mixture can contain compounds having zero or one vinyl group as well as some compounds having three or more vinyl groups.

Suitable vinyl-functional polydiorganosiloxanes include (a) vinyl-terminated polydiorganosiloxanes of Formula (I) wherein y is 0, x is one or more, each R independently represents methyl or phenyl, and each $R^2$ is vinyl (these compounds have two terminal vinyl groups); (b) polydiorganosiloxanes of Formula (I) wherein some of the internal silicon atoms have vinyl substituents rather than methyl or phenyl, x is one or more, and y is two or more, each R and $R^2$ independently represents methyl or phenyl, and $R^1$ is vinyl (these compounds can have two or more internal vinyl groups); (c) polydiorganosiloxanes of Formula (I) that have vinyl groups bonded to silicon atoms at each termini and additional vinyl groups bonded to silicon atoms in the interior, where x and y are both one or more, each R independently represents methyl or phenyl, each R' is vinyl, and each $R^2$ is vinyl (these compounds can have three or more vinyl groups); and (d) mixtures thereof.

As used herein, the term "vinyl-terminated" refers to vinyl-functional polydiorganosiloxanes where each $R^2$ is vinyl. There may be additional internal vinyl groups or there may be no additional internal vinyl groups.

In certain embodiments, the vinyl-functional polydiorganosiloxane is a vinyl-terminated polydiorganosiloxane. For example, in the vinyl-functional polydiorganosiloxanes of Formula (I), each R is methyl or phenyl, each $R^2$ is a vinyl group, y=0, and 20<x<2000. Specific examples include vinyl-terminated polydimethylsiloxanes, such as those available from Gelest, Inc. (Morrisville, Pa.) under the trade designations DMS-V21, DMS-V22, DMS-V25, DMS-V31, DMS-V35, and DMS-V42; and vinyl-terminated diphenylsiloxane-dimethylsiloxane copolymers, such as those available from Gelest, Inc. under the trade designations PDV-0325, PDV-0331, PDV-0525, PDV-1625, PDV-1631, and PDV-1635; and their mixtures.

Most preferred (and exemplified) vinyl-functional polydiorganosiloxanes include vinyl-terminated polydimethylsiloxanes of Formula (I) wherein y=0, and 20<x<2000, R is methyl, and each $R^2$ is vinyl. Specific examples include vinyl-terminated polydimethylsiloxanes, such as those available from Gelest, Inc. under the trade designations DMS-V21, DMS-V25, DMS-V22, DMS-V31, DMS-V35, and DMS-V42.

Because the vinyl-functional polydiorganosiloxane of Formula (I) are typically available as a mixture of compounds, the equivalent weight refers to the average equivalent weight for the mixture of vinyl-functional polydiorganosiloxane compounds of Formula (I). In certain embodiments, the vinyl-functional polydiorganosiloxanes of the reaction mixture have an average vinyl equivalent weight of 1900 Daltons or more. That is, 1900 grams or more of the vinyl-functional polydiorganosiloxanes provide 1 gram mole (g-mole) of vinyl groups (i.e., the average vinyl equivalent weight is greater than or equal to 1900 grams/g-mole vinyl groups). In certain embodiments, the vinyl-functional polydiorganosiloxanes have an average vinyl equivalent weight of up to 38,000 Daltons. For certain embodiments, e.g., when 20<x<2000 (in Formula (I) above) for vinyl-terminated polydiorganosiloxane, the average vinyl equivalent weight is approximately 1900 to 38000 Daltons.

In certain embodiments, the amount of vinyl-functional polydiorganosiloxanes is at least 30 percent by weight (wt-%), or at least 50 wt-%, or at least 70 wt-%, based on the total weight of vinyl-functional and thiol-functional polydiorganosiloxanes, and photoinitiators (but not fillers). In certain embodiments, the amount of vinyl-functional polydiorganosiloxanes is up to 97 wt-%, or up to 92 wt-%, or up to 85 wt-%, based on the total weight of vinyl-functional and thiol-functional polydiorganosiloxanes, and photoinitiators (but not fillers).

Thiol-Functional Polydiorganosiloxanes

Suitable thiol-functional polydiorganosiloxanes are those compounds (e.g., oligomer, polymerizable polymer (i.e., prepolymer)) that include a plurality of thiol groups. Preferably, these compounds consist of only thiol functionality. That is, there are no other groups that are reactive in these compounds other than the thiol groups. Preferably, the thiol-functional polydiorganosiloxanes may be represented by the following formula (Formula II):

$$R^5(R^3)_2SiO((R^3)_2SiO)_w(R^3R^4SiO)_zSi(R^3)_2R^5 \quad (II)$$

wherein: each $R^3$ independently represents methyl or phenyl (preferably, methyl); each $R^4$ independently represents mercaptoalkyl groups having from 2 to 12 carbon atoms; each $R^5$ independently represents methyl, phenyl, or mercaptoalkyl groups having from 2 to 12 carbons (preferably, methyl, or mercaptoalkyl groups having from 2 to 12 carbons); w=1 or more; and z=0 or more. Formula (II) may include compounds with internal thiol groups only, compounds with terminal thiol groups only, or compounds with both internal and terminal thiol groups. For compounds of Formula (II) having only internal thiol groups, z is 2 or more, each $R^4$ is mercaptoalkyl, and each $R^5$ is methyl or phenyl (preferably, methyl). For compounds of Formula (II)

having only terminal thiol groups, z=0, and each $R^5$ is mercaptoalkyl. For compounds of Formula (II) having both internal thiols and terminal thiols, z is 1 or more, each $R^4$ is mercaptoalkyl, and each $R^5$ is typically mercaptoalkyl. If one $R^5$ group is mercaptoalkyl, typically both $R^5$ groups are mercaptoalkyl groups. In Formula (II), the w repeat units $((R^3)_2SiO)$ and z repeat units $(R^3R^4SiO)$ may be within the polymer in random and/or block arrangements.

In most embodiments, the thiol-functional polydiorganosiloxanes of Formula (II) are available as a mixture of materials. The mixture usually contains materials of Formula (II) with different molecular weights. Additionally, for thiol-functional polydiorganosiloxanes having only internal thiol groups, the mixture contains an average of at least two thiol groups per compound. Such a mixture can contain compounds having zero or one thiol group as well as some compounds having three or more thiol groups.

Suitable (and preferred) examples of thiol-functional polydiorganosiloxanes include: mercaptoalkyl-terminated polydimethylsiloxanes of Formula (II) wherein z=0, w is more than or equal to 29 and less than 1000, $R^3$ is methyl, each $R^5$ independently represents a mercaptoalkyl having from 2 to 12 carbon atoms, a specific example being available from Shin-Etsu Chemical Co., Ltd. (Toyko, Japan) under the trade designation X-22-167B; polydimethylsiloxanes where some of the internal silicon atoms have mercaptoalkyl substituents having from 2 to 12 carbon atoms rather than methyl, which can be referred to as (mercaptoalkyl)methylsiloxane-dimethylsiloxane copolymers, where z is 2 or more, w/z≥15 and w+z is greater than or equal to 32 and less than 300, $R^3$ is methyl, each $R^4$ independently represents a mercaptoalkyl having from 2 to 12 carbon atoms, and $R^5$ is methyl, specific examples being available from Gelest, Inc. under the trade designations SMS-022 and SMS-042, and from Shin-Etsu Chemical Co., Ltd. under the trade designation KF-2001; and their mixtures.

Exemplified thiol-containing polydimethylsiloxanes include those of Formula (II) in which some of the internal silicon atoms have 3-mercaptopropyl substituents rather than methyl. These can be referred to as (3-mercaptopropyl)methylsiloxane-dimethylsiloxane copolymers, where z is 2 or more, w/z≥15 and w+z is greater than or equal to 32 and less than 300, $R^3$ is methyl, each $R^4$ is a 3-mercaptopropyl group, and $R^5$ is methyl, specific examples being available from Gelest, Inc. under the trade designations SMS-022 and SMS-042.

Because the thiol-functional polydiorganosiloxane of Formula (II) are typically available as a mixture of compounds, the equivalent weight reported refers to the average equivalent weight for the mixture of thiol-functional polydiorganosiloxane compounds. In certain embodiments, the thiol-functional polydiorganosiloxanes of Formula (II) have an average thiol equivalent weight of 1200 Daltons or more (i.e., an average of greater than or equal to 1200 grams/g-mole thiol groups), or 1500 Daltons or more, or 3000 Daltons or more. Higher average equivalent weights of the thiol-functional polydiorganosiloxane may afford softer and more conformable cured compositions. The average thiol equivalent weight can be up to 38,000 Daltons or more. For example, the average thiol equivalent weight can be up to 35,000 Daltons, up to 30,000 Daltons, up to 20,000 Daltons, up to 10,000 Daltons, or up to 5,000 Daltons.

In certain embodiments, the amount of thiol-functional polydiorganosiloxanes is at least 3 wt-%, or at least 8 wt-%, or at least 15 wt-%, or at least 20 wt-%, based on the total weight of vinyl-functional and thiol-functional polydiorganosiloxanes, and photoinitiators (but not fillers). In certain embodiments, the amount of thiol-functional polydiorganosiloxanes is up to 70 wt-%, or up to 50 wt-%, or up to 30 wt-%, or up to 25 wt-%, or up to 20 wt-%, or up to 15 wt-%, or up to 12 wt-%, based on the total weight of vinyl-functional and thiol-functional polydiorganosiloxanes, and photoinitiators (but not fillers).

In certain embodiments, the ratio of vinyl groups from the vinyl-functional polydiorganosiloxanes to thiol groups from the thiol-functional polydiorganosiloxanes is at least 0.8, or is at least 1.0. In certain embodiments, the ratio of vinyl groups from the vinyl-functional polydiorganosiloxanes to thiol groups from the thiol-functional polydiorganosiloxanes is up to 2.5, or up to 2.1. In certain embodiments, the ratio of vinyl groups from the vinyl-functional polydiorganosiloxanes to thiol groups from the thiol-functional polydiorganosiloxanes is 0.8 to 2.5, preferably 1.0 to 2.1.

Photocuring of the reaction mixture containing the vinyl-functional polydiorganosiloxane and the thiol-functional polydiorganosiloxane without fillers results in the formation of a silicone gel-like materials that have a shear storage modulus, G', at 25° C. and 1 Hz, less than 40,000 Pascals, preferably less than 10,000 Pascals, and more preferably less than 5,000 Pascals, and typically more than 100 Pascals. These materials have shear loss tangents (the ratio of the shear storage modulus to the shear loss modulus, G'/G") of 0.25 to 1.50, preferably 0.30 to 1.0.

Fillers

The fillers used in compositions (whether photocurable or cured) of the present disclosure have at least a bi-modal particle size distribution (e.g., bi-modal, tri-modal, and the like, or multi-modal). By this it is meant that if you plot the amount of particles versus the particle size (i.e., y axis is count, x axis is particle size), two distinct peaks are seen for a bi-modal distribution, three distinct peaks are seen for a tri-modal distribution, etc. That is, a bi-modal filler has two distinct populations, each with a different average particle size. A tri-modal filler has three distinct populations, each with a different average particle size. The multi-modal particle size distribution can provide better packing of the thermally conductive particles relative to a mono-modal particle size distribution, which in turn affords higher thermally conductivity of the cured composition. The multi-modal particle size distribution may also afford lower viscosity of the photocurable composition at the same weight or volume percent of filler relative to a mono-modal size distribution. A reduction in the viscosity of highly filled compositions often aids in their processing.

Preferably, the filler is a bi-modal filler with two distinct populations having differing average particle sizes (e.g., a first portion having an average particle size of at least 33 microns, and a second portion having an average particle size of less than 33 microns). In this context, "particle size" refers to the largest dimension of each particle, or the diameter of a spherical particle.

In certain embodiments, the filler includes a first portion having an average particle size of at least 33 microns, and a second portion having an average particle size of less than 33 microns. In certain embodiments, the first portion has an average particle size of 33 microns to 150 microns, and a second portion having an average particle size of 2 microns to less than 33 microns. For tri-modal fillers, a third portion may have an average particle size of 0.01 micron to less than 2 microns.

In certain embodiments, the second portion has an average particle size of no larger than 70% of the average particle size of the first portion. For example, a first portion may have an average particle size of 45 microns, and a second portion may have an average particle size of 5 microns. For tri-modal fillers, a third portion may have an average particle size that is no larger than 70% of the average particle size of the second portion.

In certain embodiments, a first portion is present in an amount of 50-95 wt-%, and a second portion is present in an amount of 5-50 wt-%, based on the total weight of conductive bi-modal filler. In certain embodiments, a first portion is present in an amount of 40-95 wt-%, and a second portion is present in an amount of 5-50 wt-%, and a third portion is present in an amount of 0.1-20 wt-%, based on the total weight of conductive tri-modal filler.

Suitable thermally conductive fillers are those that have a coefficient of thermal conductivity that is greater than 5 W/m° K, greater than 10 W/m° K, or greater than 15 W/m° K. Examples of thermally conductive fillers include alumina, alumina trihydrate or aluminum hydroxide, silicon carbide, boron nitride, diamond, and graphite, or mixtures thereof.

Preferred thermally conductive fillers include alumina, alumina trihydrate or aluminum hydroxide, silicon carbide, boron nitride, or mixtures thereof.

The total amount of thermally conductive filler in compositions (photocurable or cured) of the present disclosure is at least 35 wt-%, based on the total weight of the composition. In certain embodiments, the total amount of thermally conductive filler is at least 40 wt-%, or at least 50 wt-%, or at least 60 wt-%, or at least 70 wt-%, or at least 75 wt-%, or at least 80 wt-%, or at least 85 wt-%, or at least 88 wt-%, based on the total weight of the composition (photocurable or cured). In certain embodiments, the total amount of thermally conductive filler is up to 95 wt-% or up to 92 wt-%, or up to 90 wt-%, based on the total weight of the composition (photocurable or cured).

Phosphine Oxide Photoinitiators

Suitable phosphine oxide photoinitiators for use in compositions of the present disclosure include phosphine oxide photoinitiators that cure free radically photopolymerizable compositions. These include the class of phosphine oxides that typically have a functional wavelength range of approximately 370 nanometers (nm) to 1200 nm. Preferred phosphine oxide free radical photoinitiators have a functional wavelength range of approximately 370 nm to 450 nm (e.g., monoacyl and bisacyl phosphine oxides).

Suitable phosphine oxides are monoacylphosphine oxides, for example, (2,4,6-trimethylbenzoyl)-diphenylphosphine oxide or phenyl-(2,4,6-trimethylbenzoyl)-phosphinic acid ethyl ester; bisacylphosphine oxides, for example, bis(2,6-dimethoxybenzoyl)-(2,4,4-trimethyl-pent-1-yl) phosphine oxide, bis(2,4,6-trimethylbenzoyl)-phenylphosphine oxide or bis(2,4,6-trimethylbenzoyl)-(2,4-dipentoxyphenyl)phosphine oxide; and trisacylphosphine oxides.

Suitable commercially available phosphine oxide photoinitiators capable of free-radical initiation when irradiated at wavelength ranges of 380 nm to 450 nm include bis(2,4,6-trimethylbenzoyl)phenyl phosphine oxide (IRGACURE 819, BASF Corp., Tarrytown, N.Y.), bis(2,6-dimethoxybenzoyl)-(2,4,4-trimethylpentyl) phosphine oxide (CGI 403, BASF Corp.), bis(2,6-dimethoxybenzoyl)-2,4,4-trimethylpentyl phosphine oxide (in a 25:75 mixture by weight with 2-hydroxy-2-methyl-1-phenylpropan-1-one, available as IRGACURE 1700, BASF Corp.), bis(2,4,6-trimethylbenzoyl)phenyl phosphine oxide (in a 1:1 mixture by weight with 2-hydroxy-2-methyl-1-phenylpropane-1-one, available as DAROCUR 4265, BASF Corp.), and ethyl 2,4,6-trimethylbenzoylphenyl phosphinate (LUCIRIN LR8893X, BASF Corp.).

Other suitable commercially available phosphine oxide photoinitiators include those available under the trade designations IRGACURE 379 (2-Dimethylamino-2-(4-methylbenzyl)-1-(4-morpholin-4-yl-phenyl)-butan-1-one), IRGACURE 2100 (which includes as one of the components IRGACURE 819, which is phenylbis(2,4,6-trimethylbenzoyl)-phosphine oxide), LUCIRIN TPO (2,4,6-trimethylbenzoyldiphenylphosphine oxide), LUCIRIN TPO-L (ethyl-2,4,6-trimethylbenzoylphenylphosphinate), and LUCIRIN TPO-XL (which includes phenyl-bis(2,4,6-trimethylbenzoyl) phosphine oxide), which are all available from BASF Corp.

In certain embodiments, the amount of phosphine oxide photoinitiator is at least 0.1 wt-%, or at least 0.5 wt-%, based on the total weight of vinyl-functional polydiorganosiloxanes, thiol-functional polydiorganosiloxanes, and photoinitiators (but not fillers). In certain embodiments, the amount of phosphine oxide photoinitiator is up to 7 wt-%, or up to 3 wt-%, based on the total weight of vinyl-functional polydiorganosiloxanes, thiol-functional polydiorganosiloxanes, and photoinitiators (but not fillers).

Optional Secondary Photoinitiators

One or more secondary photoinitiators may be used in compositions of the present disclosure if desired. One or more secondary photoinitiators may be used to broaden the range of radiation absorbed during the curing process. They may be used, for example, to solubilize the phosphine oxide if the phosphine oxide is a solid. Alternatively, secondary photoinitiators may be solids that dissolve in the phosphine oxide.

Examples of secondary photoinitiators include α-aminoketones, α-hydroxyketones, phenylglyoxalates, thioxanthones, benzophenones, benzoin ethers, oxime esters, amine synergists, and mixtures thereof. For example, photoinitiators can include α-hydroxycycloalkyl phenyl ketones or dialkoxyacetophenones; α-hydroxy- or α-amino-acetophenones, for example, oligo-[2-hydroxy-2-methyl-1-[4-(1-methylvinyl)-phenyl]-propanone], 2-hydroxy-2-methyl-1-phenyl-propanone, 2-hydroxy-1-[4-(2-hydroxy-ethoxy)-phenyl]-2-methyl-propan-1-one, 2-methyl-1-[4-(methylthio)phenyl]-2-(4-morpholinyl)-propan-1-one, 2-dimethylamino-2-(4-methylbenzyl)-1-(4-morpholin-4-yl-phenyl)-butan-1-one, 2-benzyl-2-dimethylamino-1-(3,4-dimethoxy-phenyl)-butan-1-one, 2-benzyl-2-dimethylamino-1-(4-morpholin-4-yl-phenyl)-butan-1-one, and 2-methyl-1-(4-methylsulfanyl-phenyl)-2-morpholin-4-yl-propan-1-one; 4-aroyl-1,3-dioxolanes; benzoin alkyl ethers and benzil ketals, for example, benzil dimethyl ketal, phenyl glyoxalates and derivatives thereof, for example, methylbenzoyl formate; dimeric phenyl glyoxalates, for example, oxo-phenylacetic acid 2-[2-(2-oxo-2-phenyl-acetoxy)-ethoxy]-ethyl ester; peresters, for example, benzophenone-tetracarboxylic acid peresters, as described, for example, in EP 126 541 (Komai et al.), U.S. Pat. No. 4,777,191 (Komai et al.), and U.S. Pat. No. 4,970,244 (Komai et al.); halomethyltriazines, for example, 2-[2-(4-methoxy-phenyl)-vinyl]-4,6-bis-trichloromethyl-[1,3,5]triazine, 2-(4-methoxy-phenyl)-4,6-bis-trichloromethyl-[1,3,5]triazine, 2-(3,4-dimethoxy-phenyl)-4,6-bis-trichloromethyl-[1,3,5]triazine, and 2-methyl-4,6-bis-trichloromethyl-[1,3,5]triazine; hexaarylbisimidazole/coinitiator systems, for example, ortho-chlorohexaphenyl-bisimidazole together with 2-mercaptobenzthiazole; ferrocenium compounds or titanocenes, for example, dicyclopentadienyl bis(2,6-difluoro-3-pyrrolophenyl)titanium; borate photoinitiators or O-acyloxime photoinitiators as described, for example, in U.S. Pat. No. 6,596,445 (Matsumoto et al.).

Among preferred classes of secondary photoinitiators are α-hydroxyketones. Among preferred photoinitiators are 1-hydroxycyclohexyl-phenylketone available from Ciba Geigy now BASF under the trade designation IRGACURE 184, oligomeric α-hydroxyketones, such as those available under the trade designations ESACURE ONE or KIP 150 from Lamberti, and 2-hydroxy-2-methyl-1-phenyl-1-propanone available from Ciba Geigy now BASF under the trade designation DAROCUR 1173.

In certain embodiments, the amount of optional secondary photoinitiator, if used, is at least 0.1 wt-%, or at least 0.5 wt-%, based on the total weight of vinyl-functional polydiorganosiloxanes, thiol-functional polydiorganosiloxanes, and photoinitiators (but not fillers). In certain embodiments, the amount of optional secondary photoinitiator, if used, is up to 7 wt-%, or up to 3 wt-%, based on the total weight of vinyl-functional polydiorganosiloxanes, thiol-functional polydiorganosiloxanes, and photoinitiators (but not fillers).

Optional Photosensitizers

Herein a "photosensitizer" means a substance that either increases the rate of photo-initiated polymerization or shifts the wavelength at which polymerization occurs.

Typical photosensitizers are monoketones, diketones, and α-diketones that absorb some light of 400 nm to 520 nm (preferably, 450 nm to 500 nm). Typical compounds include camphorquinone, benzil, furil, 3,3,6,6-tetramethylcyclohexanedione, phenanthraquinone, 9,10-dialkoxyanthracenes, 1-phenyl-1,2-propanedione and other 1-aryl-2-alkyl-1,2-ethanediones, and cyclic α-diketones. In certain embodiments, the amount of photosensitizer, if used, is at least 0.1 wt-%, based on the total weight of vinyl-functional polydiorganosiloxanes, thiol-functional polydiorganosiloxanes, and photoinitiators (but not fillers). In certain embodiments, the amount of photosensitizer, if used, is up to 2 wt-%, based on the total weight of vinyl-functional polydiorganosiloxanes, thiol-functional polydiorganosiloxanes, and photoinitiators (but not fillers).

Other Optional Additives

Antioxidants and/or stabilizers such as hydroquinone monomethyl ether (p-methoxyphenol, MeHQ), pyrogallol, aluminum N-nitrosophenylhydroxylamine, and that available under the trade name IRGANOX 1010 (tetrakis(methylene(3,5-di-tert-butyl-4-hydroxyhydrocinnamate))methane) from BASF Corp., can be mixed into the curable reaction mixtures to increase its temperature stability. In certain embodiments, if used, an antioxidant and/or stabilizer is typically used in the range of 0.01 percent by weight (weight percent, wt-%) to 1.0 wt-%, based on the total weight of the curable reaction mixture.

Methods of Making

The components may be combined and stored before exposure to curable radiation, if desired. For example, a reaction mixture may be stored for up to 3 months at room temperature, and often for up to 6 months, or even up to 12 months at room temperature.

The total amount of thermally conductive filler in compositions (photocurable or cured) of the present disclosure is at least 35 wt-%, or at least 40 wt-%, or at least 50 wt-%, or at least 60 wt-%, or at least 70 wt-%, or at least 75 wt-%, or at least 80 wt-%, or at least 85 wt-%, or at least 88 wt-%, based on the total weight of the composition (photocurable or cured). The total amount of thermally conductive filler in compositions (photocurable or cured) of the present disclosure is up to 95 wt-%, or up to 92 wt-%, or up to 90 wt-%, based on the total weight of the composition (photocurable or cured). This amount may be combined in one or more parts with the total amount of non-filler components (particularly the polydiorganosiloxanes). The amount of the non-filler components (particularly the polydiorganosiloxanes) in compositions (photocurable or cured) of the present disclosure is up to 65 wt-%, or up to 60 wt-%, or up to 55 wt-%, or up to 50 wt-%, or up to 40 wt-%, or up to 30 wt-%, or up to 25 wt-%, or up to 20 wt-%, or up to 15 wt-%, or up to 12 wt-%, based on the total weight of the composition (photocurable or cured). The amount of the non-filler components (particularly the polydiorganosiloxanes) in compositions (photocurable or cured) of the present disclosure is at least 5 wt-%, or at least 8 wt-%, or at least 10 wt-%, based on the total weight of the composition (photocurable or cured).

The various components may be combined and preferably cured using continuous web-based processing methods. For example, the components of a reaction mixture can be combined, and a layer of the reaction mixture extruded or coated onto a release liner with fluorosilicone release. A second release liner can be applied on top of the layer of the reaction mixture. This construction may optionally be run through calendar rolls, and then UV irradiated, preferably on both sides. This may be done in an inert atmosphere (e.g., under nitrogen), or it may be done in air. Dose and wavelength are dependent on specific photoinitiator combinations, but generally a dose of 5-20 J/cm² UV-A irradiation (along with some UV-B, UV-C, and visible) may be used.

Uses

The thermally conductive compositions of the present disclosure may be used in electronics, lighting, and rechargeable battery assemblies to convey heat away from a heat source and transfer it to a heat sink where it can be dissipated. They may be a part of the thermal management systems of devices with semiconductor chips, such as computers, lighting based on light emitting diodes (LED's), such as in general overhead lighting and televisions.

Various articles can be made from the cured compositions of the present disclosure. In particular, a thermally conductive pad can be made. Such pads are used in electronic devices, and lighting to transfer heat away from a heat source to a heat sink, which is capable of dissipating the heat. Typical thermally conductive pads have a nominal thickness of 0.25 mm to 2 mm, and preferably, 0.5 mm.

Illustrative Embodiments

Embodiment 1 is a photocurable reaction mixture comprising:
  a vinyl-functional polydiorganosiloxane having functional groups, wherein the functional groups consist of vinyl groups, and the vinyl-functional polydiorganosiloxane is represented by the following formula (Formula I):

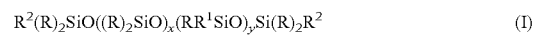

wherein:
    each R independently represents methyl or phenyl;
    each $R^1$ independently represents a vinyl group;
    each $R^2$ independently represents methyl, phenyl, or a vinyl group;
    x=1 or more;
    y=0 or more; and
    the x repeat units $((R)_2SiO)$ and y repeat units $(RR^1SiO)$ are in random and/or block arrangements;
  a thiol-functional polydiorganosiloxane having functional groups, wherein the functional groups consist of thiol groups, wherein the thiol-functional polydiorganosiloxane has an average thiol equivalent weight of 1200 Daltons or more, and wherein the thiol-functional polydiorganosiloxane is represented by the following formula (Formula II):

$$R^5(R^3)_2SiO((R^3)_2SiO)_w(R^3R^4SiO)_zSi(R^3)_2R^5 \quad (II)$$

wherein:
    each $R^3$ independently represents methyl or phenyl;
    each $R^4$ independently represents a mercaptoalkyl group having from 2 to 12 carbon atoms;
    each $R^5$ independently represents methyl, phenyl, or a mercaptoalkyl group having from 2 to 12 carbons;
    w=1 or more; and
    z=0 or more;
        the w repeat units $((R^3)_2SiO)$ and z repeat units $(R^3R^4SiO)$ are in random and/or block arrangements;
a phosphine oxide photoinitiator; and
at least 35 wt-% thermally conductive filler, based on the total weight of the photocurable reaction mixture, wherein the filler has at least a bi-modal particle size distribution.

Embodiment 2 is the photocurable reaction mixture of embodiment 1 which is curable by UV-visible radiation.

Embodiment 3 is the photocurable reaction mixture of embodiment 1 or 2 wherein the filler comprises a first portion having an average particle size of at least 33 microns, and a second portion having an average particle size of less than 33 microns.

Embodiment 4 is the photocurable reaction mixture of embodiment 3 wherein the filler comprises a first portion having an average particle size of 33 microns to 150 microns, and a second portion having an average particle size of 2 microns to less than 33 microns.

Embodiment 5 is the photocurable reaction mixture of any of embodiments 1 through 4 wherein the filler comprises a first portion and a second portion, wherein the second portion has an average particle size of no larger than 70% of the average particle size of the first portion.

Embodiment 6 is the photocurable reaction mixture of embodiment 5 wherein the first portion is present in an amount of 50-95 wt-%, and the second portion is present in an amount of 5-50 wt-%, based on the total weight of thermally conductive filler.

Embodiment 7 is the photocurable reaction mixture of any of embodiments 1 through 6 comprising at least 50 wt-% (or at least 70 wt-%) thermally conductive filler.

Embodiment 8 is the photocurable reaction mixture of any of embodiments 1 through 7 wherein the thermally conductive filler comprises alumina, alumina trihydrate or aluminum hydroxide, silicon carbide, boron nitride, or mixtures thereof.

Embodiment 9 is the photocurable reaction mixture of any of embodiments 1 through 8 wherein the components further comprise a secondary photoinitiator.

Embodiment 10 is the photocurable reaction mixture of embodiment 9 wherein the secondary photoinitiator is an α-hydroxyketone.

Embodiment 11 is the photocurable reaction mixture of any of embodiments 1 through 10 wherein the cured composition has a thermal conductivity of at least 2.4 W/m° K as measured by Measurement of Thermal Conductivity Test with 1 kg weight.

Embodiment 12 is the photocurable reaction mixture of any of embodiments 1 through 11 wherein the cured composition has a Shore 00 hardness value of up to 85.

Embodiment 13 is the photocurable reaction mixture of any of embodiments 1 through 12 wherein the vinyl-functional polydiorganosiloxane is a vinyl-terminated polydiorganosiloxane.

Embodiment 14 is the photocurable reaction mixture of any of embodiments 1 through 12 wherein the vinyl-functional polydiorganosiloxane is selected from:
    (a) compounds of Formula (I) wherein y=0, x is one or more, each R independently represents methyl or phenyl, and each $R^2$ is vinyl;
    (b) compounds of Formula (I) wherein x is one or more, y is two or more, each R and each $R^2$ independently represents methyl or phenyl, and each $R^1$ is vinyl;
    (c) compounds of Formula (I) wherein x and y are both one or more, each R independently represents methyl or phenyl, each $R^1$ is vinyl, and each $R^2$ is vinyl; and
    (d) mixtures thereof.

Embodiment 15 is the photocurable reaction mixture of embodiment 14 wherein the vinyl-functional polydiorganosiloxane is selected from the compounds of Formula (I) wherein y=0, and 20<x<2000, each R independently represents methyl or phenyl, and each $R^2$ is vinyl.

Embodiment 16 is the photocurable reaction mixture of embodiment 14 wherein the vinyl-functional polydiorganosiloxane is selected from the compounds of Formula (I) wherein y=0, and 20<x<2000, each R is methyl, and each $R^2$ is vinyl.

Embodiment 17 is the photocurable reaction mixture of any of embodiments 1 through 16 wherein in the thiol-functional polydiorganosiloxane formula (Formula (II)): each $R^3$ independently represents methyl; each $R^4$ independently represents the mercaptoalkyl group having from 2 to 12 carbon atoms; each $R^5$ independently represents methyl, or the mercaptoalkyl group having from 2 to 12 carbons; w=1 or more; and z=0 or more.

Embodiment 18 is the photocurable reaction mixture of embodiment 17 wherein the thiol-functional polydiorganosiloxanes of Formula (II) is selected from:
    (a) compounds of Formula (II) wherein z=0, w is greater than or equal to 29 and less than 1000, each $R^3$ is methyl, and each $R^5$ independently represents the mercaptoalkyl group having from 2 to 12 carbon atoms;
    (b) compounds of Formula (II) wherein z is 2 or more, w/z≥15 and w+z is greater than or equal to 32 and less than 300, each $R^3$ is methyl, each $R^4$ independently represents the mercaptoalkyl group having from 2 to 12 carbon atoms, and each $R^5$ is methyl; and
    (c) mixtures thereof.

Embodiment 19 is the photocurable reaction mixture of embodiment 18 wherein the thiol-functional polydiorganosiloxane of Formula (II) is selected from a (3-mercaptopropyl)methylsiloxane-dimethylsiloxane copolymer, wherein z is 2 or more, w/z≥15 and w+z is greater than or equal to 32 and less than 300, each $R^3$ is methyl, each $R^4$ is 3-mercaptopropyl, and each $R^5$ is methyl.

Embodiment 20 is a cured composition prepared from the reaction mixture of any of embodiments 1 through 19.

Embodiment 21 is a method of making a cured composition, the method comprising: combining components to form a photocurable reaction mixture, the components comprising:
    a vinyl-functional polydiorganosiloxane having functional groups, wherein the functional groups consist of vinyl groups, and the vinyl-functional polydiorganosiloxane is represented by the following formula (Formula I):

$$R^2(R)_2SiO((R)_2SiO)_x(RR^1SiO)_ySi(R)_2R^2 \quad (I)$$

wherein:
each R independently represents methyl or phenyl;
each $R^1$ independently represents a vinyl group;
each $R^2$ independently represents methyl, phenyl, or a vinyl group;
x=1 or more;
y=0 or more; and
the x repeat units $((R)_2SiO)$ and y repeat units $(RR^1SiO)$ are in random and/or block arrangements;
a thiol-functional polydiorganosiloxane having functional groups, wherein the functional groups consist of thiol groups, wherein the thiol-functional polydiorganosiloxane has an average thiol equivalent weight of 1200 Daltons or more, and wherein the thiol-functional polydiorganosiloxane is represented by the following formula (Formula II):

$$R^5(R^3)_2SiO((R^3)_2SiO)_w(R^3R^4SiO)_zSi(R^3)_2R^5 \quad (II)$$

wherein:
each $R^3$ independently represents methyl or phenyl;
each $R^4$ independently represents a mercaptoalkyl group having from 2 to 12 carbon atoms;
each $R^5$ independently represents methyl, phenyl, or a mercaptoalkyl group having from 2 to 12 carbons;
w=1 or more; and
z=0 or more;
the w repeat units $((R^3)_2SiO)$ and z repeat units $(R^3R^4SiO)$ are in random and/or block arrangements;
a phosphine oxide photoinitiator; and
at least 35 wt-% thermally conductive filler, based on the total weight of the photocurable reaction mixture, wherein the filler has at least a bi-modal particle size distribution; and
irradiating the photocurable reaction mixture with UV-visible radiation to form a cured composition.

Embodiment 22 is a cured composition prepared by the method of embodiment 21.

Embodiment 23 is a cured composition comprising:
a polydiorganosiloxane polymer having —C—S—C—C— linkages; and
at least 35 wt-% thermally conductive filler, based on the total weight of the composition, wherein the filler has at least a bi-modal particle size distribution;
wherein the cured composition has a thermal conductivity of at least 2.4 W/m° K as measured by Measurement of Thermal Conductivity Test with 1 kg weight, and a Shore 00 hardness of up to 85.

Embodiment 24 is a thermally conductive pad or sheet comprising the cured composition of any of embodiments 20, 22, or 23.

Embodiment 25 is the thermally conductive pad or sheet of embodiment 24 wherein the pad or sheet has a thickness of 0.25 mm to 2.0 mm.

EXAMPLES

Unless otherwise noted, all parts, percentages, ratios, etc. in the Examples and the rest of the specification are by weight.

Test Methods:
Determination of Vinyl Equivalent Weights for Vinyl-Terminated Polydimethylsiloxanes by Titration:
The vinyl content was determined by the Wijs Method (see Snell and Biffen, *Commercial Methods of Analysis*, McGraw-Hill, 1944, p. 345). The carbon double bonds were reacted with iodine monochloride (in excess) and subsequently, the excess iodine monochloride was reacted with potassium iodide to form iodine $(I_2)$, which was titrated with sodium thiosulfate. The general reaction sequence is thought to be as shown below:

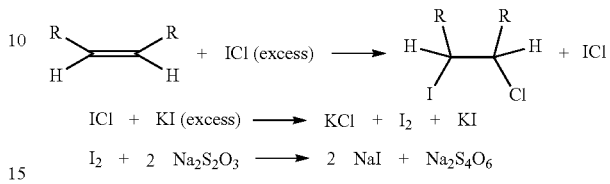

where one R in the above reaction sequence represented hydrogen and the other R represented the polydimethylsiloxane chain for the vinyl-functional polydimethylsiloxanes. The vinyl-functional polydimethylsiloxane was weighed into a 125 milliliters (mL) iodine flask, the sample containing up to but not exceeding 1.6 millimoles (mmol) of unsaturation. Supplier information on vinyl content was used initially to determine appropriate sample weight. If the titration indicated that the sample weight did not fall within specification (i.e., unsaturation not to exceed 1.6 mmol), the sample weight was adjusted and the titration repeated. Chloroform (25 mL) was added to the flask and the sample dissolved. Wijs solution (15 mL, 0.1 normal (N) iodine monochloride in glacial acetic acid) was added to the flask by pipet, the flask was then stoppered, and then was swirled vigorously. The sample stood in the dark for 30 minutes (min) with occasional swirling (approximately every 10 min). At the end of the 30 min reaction time, approximately 1 gram (g) solid KI (granular) was added to the funnel top of the flask, the stopper released slightly, and the KI rinsed into the flask with approximately 15 mL of distilled, deionized water and swirled for 1-2 min. Then 50 mL of distilled, deionized water was added to the flask, and the contents were slowly potentiometrically titrated with 0.1 N aqueous $Na_2S_2O_3$, using a METROHM 751 TITRINO autotitrator with platinum/pH combination electrode. A set of three blanks was also titrated in the same manner (i.e., no vinyl-functional polydimethylsiloxane sample was placed in the iodine flask, but the rest of the procedure was the same as above).

The Vinyl Equivalent Weight was calculated using the following equation:

$$\text{Vinyl Equivalent Weight} = \frac{(SW_{grams}) * (1000) * (2)}{(V_b - V_s) * (N)}$$

where: $V_s$ is the volume of aqueous $Na_2S_2O_3$ solution used to titrate sample, in mL
$V_b$ is the volume of aqueous $Na_2S_2O_3$ solution used to titrate blank, in mL
N is the normality of aqueous $Na_2S_2O_3$ titrant, in moles/L
$SW_{grams}$=sample weight in grams The equivalent weight calculated above is an average value for all of the vinyl-terminated polydimethylsiloxanes included in the sample (i.e., the value calculated is an average equivalent weight for the materials in each sample). Two samples of the same vinyl-functional polydimethylsiloxane material were titrated in this way, and the two values of the vinyl equivalent weight as determined from the two titrations were averaged to give a "Vinyl Equivalent Weight."

Determination of Thiol Equivalent Weights for (mercaptopropyl)methylsiloxane-dimethylsiloxane Copolymers by Titration:

The method used to determine thiol content was based upon the coordination/precipitation of silver ion by mercaptans (thiols). This methodology was adapted from that of J. H. Karchmer as cited in S. Siggia, *Quantitative Organic Analysis via Functional Groups*, Wiley & Sons, 1963, pp. 582-586.

The (mercaptopropyl)methylsiloxane-dimethylsiloxane copolymer (0.5 milliequivalents (meq) to 1.5 meq) was weighed into the titration flask, and 60 mL tetrahydrofuran was added, and the sample dissolved. Supplier information on thiol content was used initially to determine appropriate sample weight. If the titration indicated that the sample weight did not fall within specification (i.e., 0.5 meq to 1.5 meq), the sample weight was adjusted and the titration repeated. Next, 2 mL of glacial acetic acid was added to the flask via a volumetric pipette that had been rinsed with deionized (18MΩ) water and then rinsed with glacial acetic acid for the transfer. The content of the flask was titrated with approximately 0.005 N silver acetate in tetrahydrofuran using a silver-glass pH combination electrode (METROHM 6.0430.100 'SILVER TITRODE'). A set of three blanks was also titrated in the same manner (i.e., 60 mL of tetrahydrofuran was added to a titration flask without any sample, followed by 2 mL glacial acetic acid, and then the contents titrated with approximately 0.005 N silver acetate in tetrahydrofuran). Titration of the blanks agreed to within 0.01 mL of titrant.

The Thiol Equivalent Weight was calculated using the following equation:

$$\text{Thiol Equivalent Weight} = \frac{(SW_{grams}) * (1000)}{(V_s - V_b) * N}$$

where: $SW_{grams}$=sample weight in grams
$V_s$ is the Volume titrant used to titrate sample, in mL
$V_b$ is the Volume titrant used to titrate blank, in mL
N is the Normality of Titrant, in moles/L The equivalent weight calculated above is an average value for all of the thiol-functionalized polydimethylsiloxanes included in the sample (i.e., the value calculated is the average equivalent weight for the materials in each sample). Three samples of the same (mercaptopropyl)methylsiloxane-dimethylsiloxane copolymer material were titrated in this way, and the three values of the thiol equivalent weight as determined from the three titrations were averaged to give a "Thiol Equivalent Weight."

Determination of Vinyl Equivalent Weights for Vinyl-Functional Polydimethylsiloxanes by NMR Spectroscopy:

Three drops of the vinyl functional polydimethylsiloxane (PDMS) polymer was mixed with approximately 500 microliters (μL) of deuterated tetrahydrofuran (d-THF) in a two dram vial. When the PDMS was completely dissolved in the d-THF, the resulting solution was transferred to a Wilmad economy grade 5 mm borosilicate glass NMR tube. The NMR tube was placed in a spinner and pneumatically inserted into a Bruker 500 MHz AVANCE NMR spectrometer equipped with a cryogenically cooled broad-band NMR probe head. After locking and shimming operations were completed using the deuterium of the d-THF, one dimensional (1D) proton NMR data were collected using a 15 degree (15°) pulse width. One hundred twenty eight (128) transients of 32 k points were collected using an approximately 4 second acquisition time and no recycle delay. The data were Fourier Transformed (FT) without apodization, linear prediction, or zero filling.

Neglecting the residual proto-solvent resonances, the resulting spectrum showed three doublets of doublets assignable to the vinyl moieties ($^1$H NMR (500 MHz, THF) δ ppm 5.77 (dd, J=20.54, 4.16 Hz, 1H, vinyl a), 5.94 (dd, J=14.79, 4.03 Hz, 1H, b), 6.15 (dd, J=20.30, 14.92 Hz, 1H, c)), i.e., consistent with the following structure:

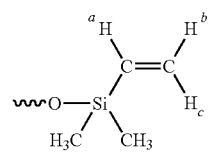

and large multiplet at 0.12 parts per million (ppm) assignable to the PDMS methyl resonances. The data were electronically integrated and the integral scale was chosen such that each of the vinyl protons had an integral of approximately 2 units. After setting this scale, the integral value of the PDMS resonance centered at 0.12 ppm was adjusted by subtraction of 12 units corresponding to the 12 protons of the four methyl groups bonded to the two silicon atoms attached to the two terminal vinyl end groups. The number of siloxane repeat units —$(CH_3)_2SiO$— associated with 2 terminal vinyl end groups was then determined by dividing the adjusted integral value of the PDMS resonance by 6. The vinyl equivalent weight was determined by multiplying this value by the molecular weight of a siloxane repeat unit (74.15) and adding the molecular weight of both vinyl end groups, which was 85.20 for $CH_2CHSi(CH_3)_2$— and 101.20 for $CH_2CHSi(CH_3)_2O$—, and then dividing the total weight by 2.

Determination of Thiol Eqivalent Weights for (mercaptopropyl)methylsiloxane-dimethylsiloxane Copolymers by NMR Spectroscopy:

Three drops of the (mercaptopropyl)methylsiloxane-dimethylsiloxane were mixed with approximately 500 microliters of deuterated tetrahydrofuran (d-THF) in a two dram vial. When the PDMS copolymer was completely dissolved in the d-THF, the resulting solution was transferred to a Wilmad economy grade 5 millimeters (mm) borosilicate glass NMR tube. The NMR tube was placed in a spinner and pneumatically inserted into a Varian 600 MHz Inova NMR spectrometer equipped with an inverse NMR probe head. After locking and shimming operations were completed using the deuterium of the d-THF, one dimensional (1D) proton NMR data were collected using a 15° pulse width. One hundred twenty eight (128) transients of 32 k points were collected using a 3 second acquisition time and no recycle delay. The data were Fourier Transformed (FT) without apodization, linear prediction, or zero filling.

Neglecting the residual proto-solvent resonances, the resulting spectrum showed seven multiplets assignable to the 3-mercaptopropyl moieties ($^1$H NMR (600 MHz, THF) δ ppm 2.49 (quartet, 2H, c), 1.67 (multiplet, 2H, b), 1.51 (triplet, 1H, d), 0.66 (multiplet, 2H, a)), consistent with the following structure:

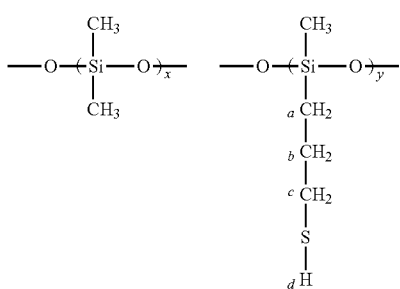

and large multiplet at 0.10 ppm assignable to the methyl resonances of the siloxane copolymer. The data were electronically integrated and the integral scale was chosen such that each of the 3-mercaptopropyl proton resonances had an integral of approximately 2 units and the thiol proton had an integral of approximately 1 unit. After setting this scale, the integral value of the methyl resonances centered at 0.10 ppm was adjusted by subtraction of 3 units corresponding to the 3 protons of the methyl group bonded to the silicon atom attached to the 3-mercaptopropyl moiety. The number of dimethylsiloxane repeat units —$(CH_3)_2SiO$— was then determined by dividing the adjusted integral value of the methyl resonances by 6. The thiol equivalent weight was determined by multiplying this value by the molecular weight of a dimethylsiloxane repeat unit (74.15) and adding the molecular weight of the (3-mercaptopropyl)methylsiloxane moiety (134.27).

Shore 00 Hardness Test:

Hardness measurements were performed with a PTC Instruments MODEL 470 DUROMETER (Pacific Transducer Corp., Los Angeles, Calif.) equipped to measure hardness on the Shore 00 scale. One inch x one inch (2.5 cm×2.5 cm) square pieces were cut or punched from the thermally conductive pads, and stacked to achieve a total thickness of 6 millimeters (mm). In the case of Examples 1-12, the pads were approximately 0.5 mm thick and 12 of the square pieces were stacked to achieve the 6 mm thickness. The hardness was measured on 3 spots of the 1 inch×1 inch (2.5 cm×2.5 cm) surface of a stack and averaged to afford the average Shore 00 hardness. The Shore 00 hardness is a measure of conformability and softness.

Measurement of Thermal Conductivity, i.e., the Coefficient of Thermal Conductivity, k:

The thermal conductivity of a sample was determined by placing a 1 inch×1 inch (2.5 cm×2.5 cm) square piece cut or punched from a thermally conductive pad onto an aluminum block with standard bright finish that was water-cooled and served as a heat sink. A 1 inch×1 inch (2.5 cm×2.5 cm) aluminum sheet (approximately 60 mil (approximately 1.5 mm) thick with standard bright finish) was placed on the other side of the sample, thus positioning the sample between the aluminum block (heat sink) and aluminum sheet. A heat source (1 inch×1 inch (2.5 cm×2.5 cm) Kapton resistive heater) was attached to the aluminum sheet on the side opposite the sample. The resistive heater was well insulated on the side opposite to or furthest away from the sample, thus virtually all the heat emanating from the source flowed through the sample to the heat sink. Thermocouples were embedded in the aluminum block (heat sink) and aluminum sheet such that the sensing junctions were adjacent to the surfaces in contact with the sample. A stage with different weights (1 kg, 3 kg, and 5 kg) was lowered onto this assembly prior to starting the measurement and the weight was maintained during the measurement. Three different thicknesses of the same pad material (1 layer (approximately 0.5 mm), 2 layers (approximately 1.0 mm), and 3 layers (approximately 1.5 mm)) were measured. The heater generated 5.239 Watts, and the temperature difference between the two opposing sides of the sample was monitored with thermocouples. The temperatures were allowed to equilibrate (i.e., come to a steady state), and then the temperature differential was recorded. The temperature of the heat sink side was usually constant for all measurements. A plot of (temperature differential) x area/Watts versus thickness was constructed. A linear regression was performed to determine the slope of the plot. The inverse of the slope was taken as the thermal conductivity "k" of the sample. This thermal conductivity test method measures the overall thermal conductivity.

Materials Used in Preparatory Examples and Examples:

The materials used in the Preparatory Examples and Examples were as listed in Table 1. The descriptive information in Table 1 was provided by the respective suppliers.

TABLE 1

| Description of Materials | |
|---|---|
| Product Name | Supplier and Description |
| Comparative Example 1 ("CE-1") | 3M Co. (St. Paul, MN), commercially available thermally conductive pad, silicone-based |
| Comparative Example 2 ("CE-2") | 3M Co. (St. Paul, MN), commercially available thermally conductive pad, silicone-based |
| DAM-05 | Denka, official name Denki Kagaku Kogyo Kabushiki Kaisha (Tokyo, Japan), spherical alumina with mean particle size of approximately 5 micrometers |
| DAM-45 | Denka, spherical alumina with mean particle size of approximately 45 micrometers |
| DAROCUR 4265 | Ciba Specialty Chemicals Corp. (Tarrytown, NY) (now BASF), photoinitiator, approximately 50 wt-% 2-hydroxy-2-methyl-1-phenyl-1-propanone and 50 wt-% diphenyl(2,4,6-trimethylbenzoyl)phosphine oxide |
| DMS-V25 | Gelest, Inc. (Morrisville, PA), vinyl-terminated polydimethylsiloxane, also referred to as a,ω-vinyl-polydimethylsiloxane, having a kinematic viscosity of approximately 500 centistokes ("cSt") |
| DMS-V31 | Gelest, Inc., vinyl-terminated polydimethylsiloxane, also referred to as a,ω-vinyl-polydimethylsiloxane, having a kinematic viscosity of approximately 1000 cSt |
| SMS-022 | Gelest, Inc., (mercaptopropyl)methylsiloxane-dimethylsiloxane copolymer having 2-3 mole % (mercaptopropyl)methylsiloxane and a kinematic viscosity of approximately 120-180 cSt |
| SMS-042 | Gelest, Inc., (mercaptopropyl)methylsiloxane-dimethylsiloxane copolymer having 4-6 mole % (mercaptopropyl)methylsiloxane and a kinematic viscosity of approximately 120-170 cSt |

PREPARATORY EXAMPLES

Preparatory Example 1

The vinyl-terminated polydimethylsiloxanes (i.e., α,ω-vinyl-polydimethylsiloxanes) DMS-V25 and DMS-V31, and the (mercaptopropyl)methylsiloxane-dimethylsiloxane copolymers SMS-022 and SMS-042 were purchased from Gelest, Inc. (Morrisville, Pa.) and used as received. These compounds are listed in Tables 2 and 3 along with their approximate molecular weight, viscosity, range of the vinyl equivalents per weight or mole % thiol-containing repeat unit for each product as reported by Gelest.

TABLE 2

Vinyl-terminated polydimethylsiloxane properties from Gelest Product Information

| Material | Mol. Wt. | Viscosity (cst) | Vinyl eq./kg |
|---|---|---|---|
| DMS-V25 | 17200 | 500 | 0.11-0.13 |
| DMS-V31 | 28000 | 1000 | 0.07-0.10 |

TABLE 3

(Mercaptopropyl)methylsiloxane-dimethylsiloxane copolymer properties from Gelest Product Information.

| Material | Mol. wt. | Viscosity (cst) | Mole % $CH_3Si((CH_2)_3SH)O$ |
|---|---|---|---|
| SMS-022 | 6000-8000 | 120-180 | 2-3 |
| SMS-042 | 7200-8000 | 120-170 | 4-6 |

The vinyl and thiol content of the vinyl-terminated and mercapto-functionalized polydimethylsiloxanes, respectively, were determined by both $^1H$ NMR and titration as described in the Test Methods section. Two different lots of DMS-V31 were utilized, and were designated as DMS-V31a and DMS-V31b. The results are reported in Table 4.

TABLE 4

Vinyl or Thiol Equivalent Weights of Functionalized Polydimethylsiloxanes

| | Functional Group Equivalent Wt. | |
|---|---|---|
| Material | by $^1H$ NMR | by Titration |
| DMS-V25 | 7067 | 6864 |
| DMS-V31a | 9018 | 8669 |
| DMS-V31b | 8938 | 8505 |
| SMS-022 | 3415 | 3585 |
| SMS-042 | 1916 | 1903 |

Preparatory Examples PE-2 to PE-10

Several formulations were made by mixing a vinyl-terminated polydimethylsiloxane (-vinyl-polydimethylsiloxane), a (mercaptopropyl)methylsiloxane-dimethylsiloxane copolymer, and approximately 1 wt-% of a free radical photoinitiator together in glass vials. The formulations contained no fillers. Table 5 contains the weights of the vinyl-terminated polydimethylsiloxane (Vinyl-PDMS) and (mercaptopropyl)methylsiloxane-dimethylsiloxane copolymer (Thiol-PDMS) components and the molar ratio of vinyl groups to thiol groups. This ratio was calculated from the weights of the vinyl-terminated polydimethylsiloxane and (mercaptopropyl)methylsiloxane-dimethylsiloxane copolymer and the vinyl and thiol equivalent weights as determined by $^1H$ NMR and titration, which were given in Table 4.

TABLE 5

Composition of PE-2 to PE-10

| Preparatory Example No. | Vinyl-PDMS (grams) | Thiol-PDMS (grams) | Photoinitiator | mole Vinyl/mole Thiol | |
|---|---|---|---|---|---|
| | | | | $^1H$ NMR | Titration |
| PE-2 | DMS-V25 1.5515 | SMS-022 0.4575 | DAROCUR 1173 | 1.60 | 1.73 |
| PE-3 | DMS-V25 1.5452 | SMS-022 0.4364 | DAROCUR 1173 | 1.73 | 1.87 |
| PE-4 | DMS-V25 1.5799 | SMS-022 0.4051 | DAROCUR 1173 | 1.87 | 2.02 |
| PE-5 | DMS-V31a 6.2313 | SMS-022 1.6914 | DAROCUR 1173 | 1.18 | 1.29 |
| PE-6 | DMS-V31a 1.2609 | SMS-022 0.3363 | DAROCUR 4265 | 1.18 | 1.29 |
| PE-7 | DMS-V31a 1.3095 | SMS-022 0.2807 | DAROCUR 4265 | 1.47 | 1.61 |
| PE-8 | DMS-V31b 1.6329 | SMS-022 0.3474 | DAROCUR 1173 | 1.79 | 1.97 |
| PE-9 | DMS-V31a 1.3518 | SMS-022 0.2444 | DAROCUR 4265 | 1.77 | 1.93 |
| PE-10 | DMS-V31b 1.7841 | SMS-042 0.1954 | DAROCUR 1173 | 1.96 | 2.05 |

Then about 1.34 g of each formulation was poured into a separate circular aluminum pan or tin, which was approximately 50 mm in diameter. The pan was placed in a vacuum oven at room temperature, and the formulation degassed by applying a vacuum of 28 to 30 inches Hg for 2 min. The pan was then removed from the vacuum oven and placed in a nitrogen purged chamber outfitted with Black Light Bulbs. The chamber was purged for 15 min with nitrogen, then the formulation irradiated with ultraviolet light at an intensity of 2.94 mW/cm$^2$ for 10 min while the nitrogen purge continued. The viscoelastic properties of the cured formulation were determined by parallel plate rheometry on a TA Instruments (New Castle, Del.) AR-2000, and 8 mm diameter aluminum plates were employed. Oscillatory shear measurements were performed at 0.40% strain with a gap between plates of 1.0-1.5 mm. Table 6 reports the shear storage modulus, G', the shear loss modulus, G", and the loss tangent (tan δ or G"/G') at approximately 25° C. and 1 Hz for the cured formulations.

TABLE 6

Characterization of PE-2 to PE-10

| Preparatory Example | Vinyl-PDMS | Thiol-PDMS | Vinyl/Thiol by $^1H$ NMR | G' (Pa) | G" (Pa) | tan δ |
|---|---|---|---|---|---|---|
| PE-2 | DMS-V25 | SMS-022 | 1.60 | 1470 | 751 | 0.51 |
| PE-3 | DMS-V25 | SMS-022 | 1.73 | 1307 | 872 | 0.67 |
| PE-4 | DMS-V25 | SMS-022 | 1.87 | 1069 | 764 | 0.72 |
| PE-5 | DMS-V31 | SMS-022 | 1.18 | 2452 | 1129 | 0.46 |
| PE-6 | DMS-V31 | SMS-022 | 1.18 | 3884 | 1654 | 0.43 |
| PE-7 | DMS-V31 | SMS-022 | 1.47 | 1186 | 836 | 0.70 |
| PE-8 | DMS-V31 | SMS-022 | 1.79 | 412 | 480 | 1.16 |
| PE-9 | DMS-V31 | SMS-022 | 1.77 | 527 | 734 | 1.39 |
| PE-10 | DMS-V31 | SMS-042 | 1.96 | 2842 | 850 | 0.30 |

Examples 1-12

Formulations were made by weighing a vinyl-terminated polydimethylsiloxane (α,ω)-vinyl-polydimethylsiloxane), a (mercaptopropyl)methylsiloxane-dimethylsiloxane copolymer, a free radical photoinitiator, DAROCUR 4265, and spherical alumina, DAM-45 and DAM-05, into a plastic mixing cup. All Examples, except Example 5, used a MAX 40 mixing cup (Flack Tek Inc., Landrum, S.C.). In Example 5, a larger mixing cup (MAX 100) was used to accommodate the larger amount of formulation. The contents of the cups were mixed in a centrifugal mixer, SPEEDMIXER DAC 150 (Flack Tek Inc., Landrum, S.C.), at approximately 3000 revolutions per minute (rpm) for 1 minute. All formulations were approximately 11 wt-% of the silicone resin component, 55 wt-% of spherical alumina DAM-45 (Denka, Japan), and 34 wt-% of spherical alumina DAM-05 (Denka). The combination of DAM-45 and DAM-05 provided a bimodal particle size distribution for the spherical alumina. The silicone resin component included the vinyl-terminated polydimethylsiloxane, the (mercaptopropyl)methylsiloxane-dimethylsiloxane copolymer, and DAROCUR 4265. The DAROCUR 4265 was present in the silicone resin component at 2 wt-%. The components and their weights for each formulation were as given in Table 7.

TABLE 7

Composition of Examples 1-12

| Example | Vinyl-PDMS (grams) | Thiol-PDMS (grams) | DAROCUR 4265 (grams) | DAM-45 (grams) | DAM-05 (grams) |
|---|---|---|---|---|---|
| 1 | DMS-V25 3.7231 | SMS-022 1.1302 | 0.0992 | 24.7496 | 15.2996 |
| 2 | DMS-V25 3.7900 | SMS-022 1.0605 | 0.0982 | 24.7535 | 15.3040 |
| 3 | DMS-V25 3.8282 | SMS-022 1.0292 | 0.0982 | 24.7494 | 15.3008 |
| 4 | DMS-V25 3.8524 | SMS-022 0.9994 | 0.0985 | 24.9185 | 15.3062 |
| 5 | DMS-V31a 6.3639 | SMS-022 1.7229 | 0.1654 | 41.2564 | 25.5038 |
| 6 | DMS-V31b 3.8595 | SMS-022 0.9924 | 0.0993 | 24.7504 | 15.3039 |
| 7 | DMS-V31b 3.9315 | SMS-022 0.9222 | 0.0980 | 24.7481 | 15.3029 |
| 8 | DMS-V31b 3.8141 | SMS-022 0.8178 | 0.0965 | 23.6500 | 14.6215 |
| 9 | DMS-V31b 3.8429 | SMS-022 0.7922 | 0.0935 | 23.6490 | 14.6193 |
| 10 | DMS-V31b 3.8697 | SMS-022 0.7665 | 0.0945 | 23.6522 | 14.6198 |
| 11 | DMS-V31b 4.3817 | SMS-042 0.4795 | 0.0990 | 24.7520 | 15.3055 |
| 12 | DMS-V31b 4.4069 | SMS-042 0.4517 | 0.0990 | 24.7550 | 15.2983 |

The molar ratio of vinyl groups to thiol groups for the formulations of Examples 1-12 were calculated based on the weights of the vinyl-terminated polydimethylsiloxane and (mercaptopropyl)methylsiloxane-dimethylsiloxane copolymer and the vinyl and thiol equivalent weights as determined by $^1$H NMR and titration, which were given in Table 4. The molar ratios of the formulations were as given in Table 8.

TABLE 8

Examples 1-12 Ratio of Moles Vinyl to Moles Thiol

| | Moles Vinyl/Moles Thiol | |
|---|---|---|
| Example | by $^1$H NMR | By Titration |
| 1 | 1.60 | 1.73 |
| 2 | 1.73 | 1.87 |
| 3 | 1.80 | 1.95 |
| 4 | 1.87 | 2.02 |
| 5 | 1.18 | 1.29 |
| 6 | 1.49 | 1.64 |
| 7 | 1.64 | 1.81 |
| 8 | 1.79 | 1.97 |
| 9 | 1.86 | 2.05 |
| 10 | 1.93 | 2.13 |
| 11 | 1.96 | 2.05 |
| 12 | 2.12 | 2.22 |

The formulations were made into thermally conductive pads by placing 40.93 grams to 43.77 grams of the formulation into a rectangular space of 180 mm by 140 mm on release liner (MD11, fluorosilicone release on a 2 mil (51 micrometer) thick polyethylene terephthalate film, obtained from Siliconature USA, LLC, Chicago, Ill.). The rectangular space was defined by stainless steel shims that were 0.5 mm thick and 19 mm wide, four of which were laid on the MD11 release liner to enclose the rectangular space. Another piece of release liner was laid over the formulation, shims, and bottom release liner. This entire assembly was place between two 3.2 mm thick aluminum plates and pressed at room temperature from 0 to 18000 pounds (lb) (8165 kilograms (kg)) over the course of 7 minutes (min), and then held at 18000 lb (8165 kg) for 3 min in a hydraulic platen press. The assembly was then removed from the press, the top aluminum plate removed, and the formulation between release liners irradiated with UV light by placing on a conveyor belt of a "FUSION PROCESSOR" (Fusion UV Systems, Inc., Gaithersburg, Md.) and passed under a D BULB to receive a dose of approximately 1.75 Joules/cm$^2$ of UV-A radiation in one pass. No attempt was made to measure UV-B and UV-C radiation. The assembly was passed under the D BULB four times, then the formulation between release liners flipped over and passed under the D BULB another four times for a total of eight passes. The release liners and stainless steel shims were removed to yield an approximately 180 mm×140 mm×0.5 mm thermally conductive pad. The Shore 00 hardness and thermal conductivity of these pads were measured as described in the Test Methods, with results as listed in Table 9. Two comparative examples (i.e., "CE-1" and "CE-2", which were commercially available silicone-based thermally conductive pads made via thermal hydrosilylation reaction) were measured in the same manner, i.e., as described in the Test Methods, and were observed to have Shore 00 hardness and thermal conductivity values as listed in Table 9. In Table 9, "ND" indicates "not determined", and "NA" indicates "not applicable".

TABLE 9

Properties of Filled Sample Pads

| Example | Vinyl-PDMS | Thiol-PDMS | Vinyl/Thiol by $^1$H NMR | Shore 00 Hardness (average) | Thermal Cond., k (W/m°K) 1 kg | 3 kg | 5 kg |
|---|---|---|---|---|---|---|---|
| 1 | DMS-V25 | SMS-022 | 1.60 | 64 | 2.50 | 2.44 | 2.36 |
| 2 | DMS-V25 | SMS-022 | 1.73 | 61 | 2.56 | 2.78 | 2.94 |

TABLE 9-continued

Properties of Filled Sample Pads

| Example | Vinyl-PDMS | Thiol-PDMS | Vinyl/Thiol by $^1$H NMR | Shore 00 Hardness (average) | Thermal Cond., k (W/m°K) | | |
|---|---|---|---|---|---|---|---|
| | | | | | 1 kg | 3 kg | 5 kg |
| 3 | DMS-V25 | SMS-022 | 1.80 | 55 | 3.23 | 3.23 | 3.22 |
| 4 | DMS-V25 | SMS-022 | 1.87 | 40 | 2.89 | 3.07 | 3.58 |
| 5 | DMS-V31 | SMS-022 | 1.18 | 75 | ND | ND | ND |
| 6 | DMS-V31 | SMS-022 | 1.49 | 73 | 3.90 | 3.89 | 3.56 |
| 7 | DMS-V31 | SMS-022 | 1.64 | 67 | 2.60 | 2.60 | 3.07 |
| 8 | DMS-V31 | SMS-022 | 1.79 | 49 | 2.57 | 2.66 | 2.97 |
| 9 | DMS-V31 | SMS-022 | 1.86 | 46 | 2.64 | 2.64 | 3.14 |
| 10 | DMS-V31 | SMS-022 | 1.93 | 35 | 3.18 | 3.18 | 3.40 |
| 11 | DMS-V31 | SMS-042 | 1.96 | 84 | 2.52 | 2.59 | 2.62 |
| 12 | DMS-V31 | SMS-042 | 2.12 | 76 | ND | ND | ND |
| CE-1 | NA | NA | NA | 75 | 2.40 | 2.40 | 2.40 |
| CE-2 | NA | NA | NA | 29 | 1.48 | 1.86 | 2.31 |

Comparative Example 3 (CE-3)

A formulation that was very similar to that of Example 1 was made in the same manner as Example 1, except only DAM-45 was used as the thermally conductive filler and not both DAM-45 and DAM-05. The amount of DAM-45 used was 89 wt-% of the total formulation, which was the same wt-% for the combination of DAM-45 and DAM-05 in the formulation of Example 1. The formulation was then processed in the same manner of Example 1 in order to manufacture a thermally conductive pad. However, after pressing the formulation in a hydraulic platen press to 18,000 lb and holding for 3 min, the formulation did not spread to fill the entire space defined by the stainless steel shims, so the assembly was placed in the press again and taken to 37,000 lb over the course of a few minutes and held at 37,000 lb for 3 min After removing the sample from the press, the formulation had spread to cover only about 41% of the 180 mm by 140 mm area defined by the shims, and consequently the sample was much thicker than the targeted 0.5 mm thickness. The viscosity of the formulation was too high to allow fabrication of the pad.

Comparative Example 4 (CE-4)

A formulation that was very similar to that of Example 1 was made in the same manner as Example 1, except only DAM-05 was used as the thermally conductive filler and not both DAM-45 and DAM-05. The amount of DAM-05 used was 89 wt-% of the total formulation, which was the same wt-% for the combination of DAM-45 and DAM-05 in the formulation of Example 1. The formulation was then processed in the same manner of Example 1 in order to manufacture a thermally conductive pad. However, after pressing the formulation in a hydraulic platen press to 18,000 lb and holding for 3 min, the formulation did not spread to fill the entire space defined by the stainless steel shims, so the assembly was placed in the press again and taken to 25,000 lb, and while the formulation had flowed more, it had not filled the entire space defined by the shims Again, the assembly was placed in the press and taken to 30,000 lb over the course of a few minutes and held for 3 min. After removing the sample from the press, the formulation had spread to cover more than 95% of the 180 mm by 140 mm area defined by the shims. The sample was then cured by irradiation with UV light in the same manner as described for Example 1 to afford a thermally conductive pad that contained thermally conductive filler with a monomodal particle size distribution. The thermal conductivity (with 1 kg weight) and Shore 00 hardness was determined in the same manner as described for Example 1. The sample had a thermal conductivity, k, of 1.84 W/m ° K and Shore 00 hardness of 81.

All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A photocurable reaction mixture comprising:
a vinyl-functional polydiorganosiloxane having functional groups, wherein the functional groups consist of vinyl groups, and the vinyl-functional polydiorganosiloxane is represented by the following formula (Formula I):

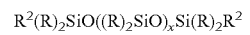
$R^2(R)_2SiO((R)_2SiO)_xSi(R)_2R^2$ wherein:
each R independently represents methyl or phenyl;
each $R^2$ independently represents methyl, phenyl, or vinyl groups;
x=1 or more; and a thiol-functional polydiorganosiloxane having functional groups, wherein the functional groups consist of thiol groups, wherein the thiol-functional polydiorganosiloxane has an average thiol equivalent weight of 1200 Daltons or more, and wherein the thiol-functional polydiorganosiloxane is represented by the following formula (Formula II):

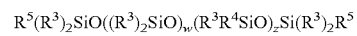
$R^5(R^3)_2SiO((R^3)_2SiO)_w(R^3R^4SiO)_zSi(R^3)_2R^5$ wherein:
each $R^3$ independently represents methyl or phenyl;
each $R^4$ independently represents a mercaptoalkyl group having from 2 to 12 carbon atoms;
each $R^5$ independently represents methyl, phenyl, or a mercaptoalkyl group having from 2 to 12 carbons;
w=1 or more; and
z>0;

the w repeat units ((R³)2SiO) and z repeat units (R³R⁴SiO) are in random and/or block arrangements;
a phosphine oxide photoinitiator; and
at least 35 wt-% thermally conductive filler, based on the total weight of the photocurable reaction mixture, wherein the filler has at least a bi-modal particle size distribution.

2. The photocurable reaction mixture of claim 1 which is curable by UV-visible radiation.

3. The photocurable reaction mixture of claim 1 wherein the filler comprises a first portion having an average particle size of at least 33 microns, and a second portion having an average particle size of less than 33 microns.

4. The photocurable reaction mixture of claim 3 wherein the filler comprises a first portion having an average particle size of 33 microns to 150 microns, and a second portion having an average particle size of 2 microns to less than 33 microns.

5. The photocurable reaction mixture of claim 1 wherein the filler comprises a first portion and a second portion, wherein the second portion has an average particle size of no larger than 70% of the average particle size of the first portion.

6. The photocurable reaction mixture of claim 5 wherein the first portion is present in an amount of 50-95 wt-%, and the second portion is present in an amount of 5-50 wt-%, based on the total weight of thermally conductive filler.

7. The photocurable reaction mixture of claim 6 comprising at least 70 wt-% thermally conductive filler.

8. The photocurable reaction mixture of claim 1 wherein the thermally conductive filler comprises alumina, alumina trihydrate or aluminum hydroxide, silicon carbide, boron nitride, or mixtures thereof.

9. The photocurable reaction mixture of claim 1 wherein the components further comprise a secondary photoinitiator.

10. The photocurable reaction mixture of claim 9 wherein the secondary photoinitiator is an α-hydroxyketone.

11. The photocurable reaction mixture of claim 1 wherein the cured composition has a thermal conductivity of at least 2.4 W/m° K as measured by Measurement of Thermal Conductivity Test with 1 kg weight.

12. The photocurable reaction mixture of claim 1 wherein the cured composition has a Shore 00 hardness value of up to 85.

13. The photocurable reaction mixture of claim 1 wherein the vinyl-functional polydiorganosiloxane is selected from compounds of Formula (I) wherein each R independently represents methyl or phenyl, and each $R^2$ is vinyl.

14. The photocurable reaction mixture of claim 13 wherein the vinyl-functional polydiorganosiloxane is selected from compounds of Formula (I) wherein 20<x<2000, each R independently represents methyl or phenyl, and each $R^2$ is vinyl.

15. The photocurable reaction mixture of claim 13 wherein the vinyl-functional polydiorganosiloxane is selected from compounds of Formula (I) wherein 20<x<2000, each R is methyl, and each $R^2$ is vinyl.

16. The photocurable reaction mixture of claim 1 wherein in the thiol-functional polydiorganosiloxane formula (Formula (II): each $R^3$ independently represents methyl; each $R^4$ independently represents mercaptoalkyl groups having from 2 to 12 carbon atoms; each $R^5$ independently represents methyl, or mercaptoalkyl groups having from 2 to 12 carbons; and w=1 or more.

17. The photocurable reaction mixture of claim 16 wherein the thiol-functional polydiorganosiloxane of Formula (II) is selected from
compounds of Formula (II) wherein z is 2 or more, w/z≥15 and w+z is greater than or equal to 32 and less than 300, each $R^3$ is methyl, each $R^4$ independently represents a mercaptoalkyl having from 2 to 12 carbon atoms, and each $R^5$ is methyl.

18. The photocurable reaction mixture of claim 17 wherein the thiol-functional polydiorganosiloxane of Formula (II) is selected from a (3-mercaptopropyl)-methylsiloxane-dimethylsiloxane copolymer, wherein z is 2 or more, w/z≥15 and w+z is greater than or equal to 32 and less than 300, each $R^3$ is methyl, each $R^4$ is 3-mercaptopropyl, and each $R^5$ is methyl.

19. A cured composition prepared from the reaction mixture of claim 1.

20. A method of making a cured composition, the method comprising:
combining components to form a photocurable reaction mixture, the components comprising:
a vinyl-functional polydiorganosiloxane having functional groups, wherein the functional groups consist of vinyl groups, and the vinyl-functional polydiorganosiloxane is represented by the following formula (Formula I):

$$R^2(R)_2SiO((R)_2SiO)_xSi(R)_2R^2 \quad (I)$$

wherein:
each R independently represents methyl or phenyl;
each $R^2$ independently represents methyl, phenyl, or a vinyl group;
x=1 or more; and
a thiol-functional polydiorganosiloxane having functional groups, wherein the functional groups consist of thiol groups, wherein the thiol-functional polydiorganosiloxane has an average thiol equivalent weight of 1200 Daltons or more, and wherein the thiol-functional polydiorganosiloxane is represented by the following formula (Formula II):

$$R^5(R^3)_2SiO((R^3)_2SiO)_w(R^3R^4SiO)_zSi(R^3)_2R^5 \quad (II)$$

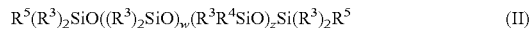

wherein:
each $R^3$ independently represents methyl or phenyl;
each $R^4$ independently represents a mercaptoalkyl group having from 2 to 12 carbon atoms;
each $R^5$ independently represents methyl, phenyl, or a mercaptoalkyl group having from 2 to 12 carbons;
w=1 or more; and
z>0;
the w repeat units ((R³)₂SiO) and z repeat units (R³R⁴SiO) are in random and/or block arrangements;
a phosphine oxide photoinitiator; and
at least 35 wt-% thermally conductive filler, based on the total weight of the photocurable reaction mixture, wherein the filler has at least a bi-modal particle size distribution; and
irradiating the photocurable reaction mixture with UV-visible radiation to form a cured composition.

21. A cured composition prepared by the method of claim 20.

* * * * *

UNITED STATES PATENT AND TRADEMARK OFFICE
CERTIFICATE OF CORRECTION

PATENT NO. : 9,994,754 B2
APPLICATION NO. : 15/129532
DATED : June 12, 2018
INVENTOR(S) : Robert Clough It is certified that error appears in the above-identified patent and that said Letters Patent is hereby corrected as shown below:

On the Title Page

Column 1 (Notice)
Line 3, After "0 days." delete "days.".

In the Specification

Column 7
Line 24, Delete "(Toyko," and insert -- (Tokyo, --, therefor.

Column 18
Line 43, Delete "Eqivalent" and insert -- Equivalent --, therefor.

Column 20
Lines 40-41 (Approx.), Delete "a,ω-vinyl- polydimethylsiloxane," and insert
-- α,ω-vinyl-polydimethylsiloxane, --, therefor.

Column 20
Lines 43-44 (Approx.), Delete "a,ω-vinyl-polydimethylsiloxane," and insert
-- α,ω-vinyl-polydimethylsiloxane, --, therefor.

Column 22
Line 64, Delete "(α,ω)-vinyl-polydimethylsiloxane)," and insert
-- (α,ω-vinyl-polydimethylsiloxane), --, therefor.

Column 25
Line 37, After "min" insert -- . --.

Signed and Sealed this
Eighteenth Day of June, 2019

Andrei Iancu
*Director of the United States Patent and Trademark Office*

CERTIFICATE OF CORRECTION (continued)
U.S. Pat. No. 9,994,754 B2

Column 25
Line 60, After "shims" insert -- . --.

In the Claims

Column 27
Line 1, In Claim 1, delete "(($R^3$)2SiO)" and insert -- (($R^3$)$_2$SiO) --, therefor.

Column 27
Lines 61-62 (Approx.), In Claim 16, delete "(Formula" and insert -- Formula --, therefor.